United States Patent [19]

Imaoka et al.

[11] Patent Number: 5,426,073
[45] Date of Patent: Jun. 20, 1995

[54] METHOD OF FABRICATING SEMICONDUCTOR DEVICES USING AN INTERMEDIATE GRINDING STEP

[75] Inventors: Kazunori Imaoka, Komae; Yoichi Fujisawa, Kawasaki, both of Japan

[73] Assignee: Fujitsu Limited, Kawasaki, Japan

[21] Appl. No.: 135,577

[22] Filed: Oct. 13, 1993

Related U.S. Application Data

[63] Continuation of Ser. No. 584,483, Sep. 17, 1990, abandoned, which is a continuation of Ser. No. 413,754, Sep. 28, 1989, abandoned.

[30] Foreign Application Priority Data

Oct. 7, 1988 [JP] Japan .................. 63-254101

[51] Int. Cl.$^6$ ............ H01L 21/00; H01L 21/02; H01L 21/302; H01L 21/463
[52] U.S. Cl. ............................ 437/225; 437/228
[58] Field of Search .......... 437/225, 226, 228, 249; 148/DIG. 51, DIG. 135, DIG. 145

[56] References Cited

U.S. PATENT DOCUMENTS

| | | | |
|---|---|---|---|
| 4,144,099 | 4/1979 | Edmonds et al. | 437/225 |
| 4,510,176 | 4/1985 | Cuthbert et al. | 437/228 |
| 4,567,646 | 2/1986 | Ishikawa et al. | 437/62 |
| 4,631,804 | 12/1986 | Roy | 437/228 |
| 4,638,553 | 1/1987 | Nilarp | 437/227 |
| 4,662,956 | 5/1987 | Roth et al. | 437/228 |

FOREIGN PATENT DOCUMENTS

| | | |
|---|---|---|
| 0145573 | 6/1985 | European Pat. Off. . |
| 0297648 | 1/1989 | European Pat. Off. . |
| A-1378542 | 12/1963 | France . |
| A-3335116 | 3/1984 | Germany . |
| 0058338 | 4/1982 | Japan ............... 437/62 |
| 0188921 | 10/1984 | Japan . |

OTHER PUBLICATIONS

Patent Abstracts of Japan, vol. 9, No. 49 (E-300) [1772], 2nd Mar. 1985; & JP-A-59 188 921 (Nippon Denki K.K.) 26 Oct., 1984.
Patent Abstracts of Japan, vol. 7, No. 204 (E-197) [1349], 9th Sep. 1983; & JP-A-58 100 432 (Hitachi Seisakusho K.K.) Jun. 15, 1983.
European Search Rpt., conducted at The Hague on Apr. 4, 1990 by Examiner J. F. M. Gelebart.

Primary Examiner—R. Bruce Breneman
Assistant Examiner—B. Everhart
Attorney, Agent, or Firm—Staas & Halsey

[57] ABSTRACT

In wafer processes, after at least one layer which constitutes a structural member of a functional semiconductor element is formed on a semiconductor wafer, a brittle, excessive deposition on an edge of the semiconductor wafer is removed by grinding or etching of the wafer edge until the underlying wafer is exposed. The removal of the excessive deposition on the wafer edge reduces dust generation caused from crack and peel-off of the excessive deposition on the wafer edge, even if the wafer edge contacts a jig, and the like. Thus, the reduction in dust generation improves production yields of highly integrated semiconductor devices.

16 Claims, 6 Drawing Sheets

METHOD OF FABRICATING SEMICONDUCTOR DEVICES USING AN INTERMEDIATE GRINDING STEP

This application is a continuation of U.S. patent application Ser. No. 07/584,483, filed Sep. 17, 1990, now abandoned, which is a continuation of application Ser. No. 07/413,754, filed on Sep. 28, 1989, now abandoned.

BACKGROUND OF THE INVENTION

1. Field of the Invention

The present invention relates to a fabrication method of a semiconductor device, and particularly to a method to reduce dust generation out of its semiconductor wafer under wafer processes.

2. Description of the Related Art

In recent years, as a result of advances of high density as well as high degree integration of semiconductor integrated circuits (referred to hereinafter as IC), semiconductor elements or wiring patterns having a minimum size below 1 $\mu$m have been achieved. Such high integration capability has been accomplishing more than one million semiconductor elements on a single chip. Most of thus highly integrated semiconductor chips have an area of more than 70 mm$^2$. Thus finely fabricated elements of the structural members as well as thus increased area size of the IC chips have been causing a problem in that the quantity of the defects resulting from the fine dust on the order of 0.1 $\mu$m generated during the wafer process affects yield of the IC fabrication.

It is known that the size of defects which affect the fabrication yield of the semiconductor devices is about one fifth through one tenth of the minimum width of wiring pattern of the semiconductor device. For example, for an IC whose design is based on 1 $\mu$m wiring width, defects of about 0.1–0.2 $\mu$m in size caused from fine dust must be controlled. In an IC of about 20 mm$^2$ chip area, density of the above-described defects must be below 0.02 pieces/mm$^2$ in order to achieve satisfactory yield. When the chip area is as large as about 70 mm$^2$, it is estimated that the defects density must be below 0.004 pieces/mm$^2$ in order to achieve the same yield.

Figure 1:
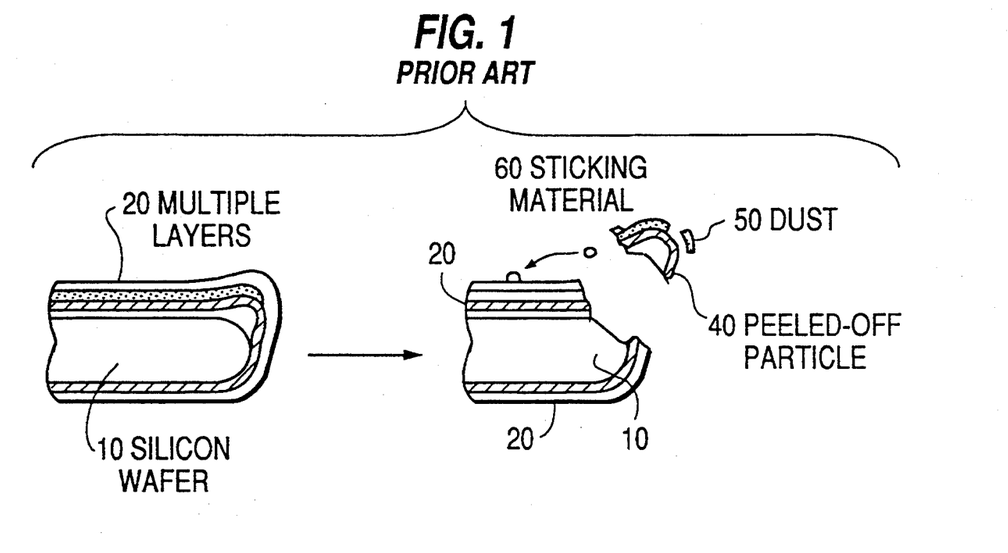
FIG. 1 shows a mechanism of generating dust caused from peel-off of a wafer edge.

There are two major sources of generated particles, such as dust, sticking onto a semiconductor wafer during wafer processes. One of them is fine dust included in the water, air or chemicals which may directly contact the semiconductor wafer. This dust is prevented by enhancing the cleanliness of the water, air or chemicals. Another source is, as shown in FIG. 1, small particles 50 and 60 generated when a piece 40 is cracked or peeled off from an edge of the wafer 10. In FIG. 1, the wafer edge before generating the crack and peel-off is shown on the left hand side, as well as the state after the crack and peel-off is shown on the right hand side. These cracks and peel-offs are generated during the wafer process by contacts of the semiconductor wafer with jigs, such as wafer holders or tweezers, to hold the wafer. The mechanism of generating cracks is described later in detail. In order to prevent the crack and peel-off, in the prior art it has been a general measure that the shape and material of a portion in direct contact with the semiconductor wafer, of the jigs are appropriately chosen so that the force per unit area imposed upon the handled wafer becomes as small as possible.

On the other hand, peripheral edges of the semiconductor wafer under process which frequently contact the jigs, and the like, have been chamfered or rounded in advance, prior to the wafer process. However, no additional method to prevent dust generation out of the wafer under process has been particularly considered during the wafer processes.

Figure 2:
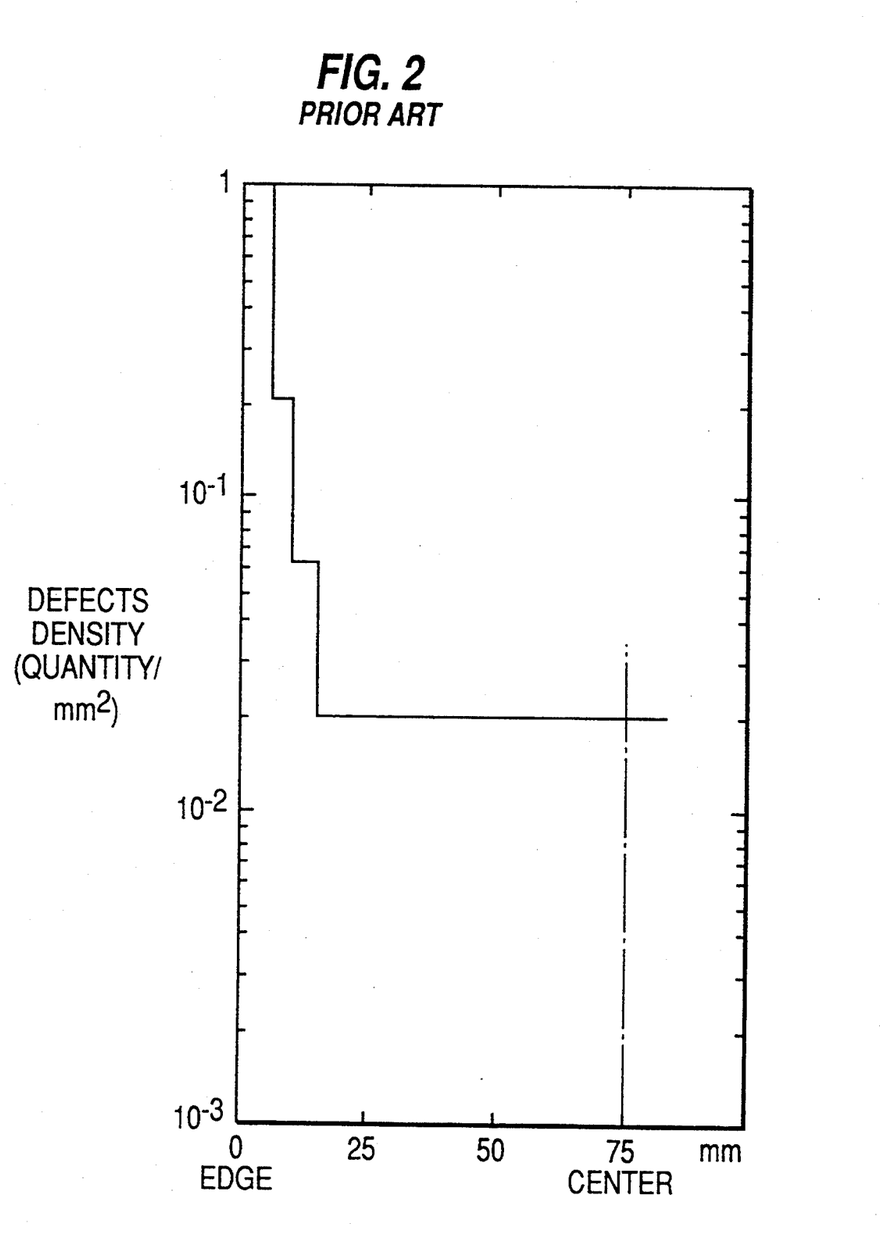
FIG. 2 is a graph showing distribution of defects density on a processed wafer according to the present invention.

FIG. 2 is a graph showing distribution of defects on a wafer surface, observed after the last step of wafer processes according to the prior art method in fabrication of a metal oxide semiconductor (referred to hereinafter as MOS) integrated circuit. The graph is of defects larger than 0.2 $\mu$m in size distributed along radial direction of a silicon monocrystalline wafer of six inch diameter having MOS ICs of 2 $\mu$m design rule formed thereupon. As seen from the graph, the defects density is approximately $2 \times 10^{-2}$/mm$^2$ almost constantly through the region apart more than 15 mm from the wafer edge and towards the inside. However, the defects density becomes greater closer to the wafer edge. The reason why the defects density is greater on the wafer edge is believed to be that various layers 20 (FIG. 1) deposited on the wafer edge are peeled off and fall onto the wafer when the wafer edge touches a jig holding the wafer during the wafer processes as shown in FIG. 1, or dust generated from scratches on the wafer 10 itself floats up and deposits onto the wafer.

According to the facts described above, the size of the defects which affect the production yield of a semiconductor device is found to be larger than about 1/5–1/10 of the minimum wiring width of the semiconductor device. Therefore, when the size of the smallest portion of the semiconductor device to be fabricated is on the order of several microns, dust size affecting the production yield can be relatively large, for example, larger than about 0.5 $\mu$m. Accordingly, even if dust is generated from the wafer edge as shown in FIG. 1, the quantity of the relatively large dust affecting the production yield is not so large, and such large dust will deposit on the wafer edge area which is close to the generation source; therefore, the effect rarely extends to the inner area of the wafer. However, if the semiconductor device should have fine elements, such as minimum wiring width below 1 $\mu$m, fine dust as small as on the order of 0.1 $\mu$m affects the production yield. Then, it is natural that the quantity of such fine dust becomes large. Furthermore, the fine dust on the order of 0.1 $\mu$m easily suspends in water or solution as well as floats in a gas stream. Accordingly, once the dust is generated, its effect not only stays in the vicinity of the generation source but also extends into the central area of the wafer, resulting in further reduction of the production yield of the semiconductor device.

The higher density, higher degree of integration, integrated IC requires a more complex structure. Accordingly, wafer processes for as many as 10 or more layers are then in need. During such processes, a semiconductor layer such as polycrystalline silicon layer, an insulating layer such as silicon dioxide or silicon nitride, or a metal layer such as aluminum wiring are deposited on the wafer edge and grow as the wafer process is progressed. Prior to these processes for fabricating semiconductor elements, such as transistors, etc., the wafer has been prepared so that the wafer edge 1' is chamfered or rounded as seen in the cross-sectional view in FIG. 1 or FIGS. 3(a), 3(b) and 3(c). This preparative treatment of the wafer is also disclosed in U.S. Pat. No. 4,567,646 by Ishikawa et al., where a wafer edge on which silicon has been excessively grown during a silicon deposition process onto the wafer is trimmed to be round. Even though the wafer has been thus prepared, on the wafer edge an abnormal layer growth, such as a thicker layer than that formed on the flat primary plane of the wafer, is likely to further take place in each process step for fabricating thereon semiconductor elements, such as a transistor, its wiring, etc., because there is exposed a crystalline plane distinct from the primary plane of the wafer. As the number of the layer formations is increased, the abnormal layer growths are accumulated to form a shape different from that of the underlying wafer edge, resulting in a protrusion on the edge. Such a protrusion on the edge easily generates a local stress by contacting a jig, accordingly, is likely to crack and peel off. Furthermore, different thermal expansion coefficients for the material of each layer cause thermal stresses on the laminated layers at each heat process. Therefore, a large number of layer laminations makes the protrusion more likely to crack and peel off by the contact with the jigs, and the like. An increase in the IC chip size has brought an increase in the semiconductor wafer size, accordingly, an increase in the weight. Therefore, thus increased wafer weight further increases a local stress imposed on the protrusion during the wafer handling. Thus, the peel off of the laminated layers on the wafer edge becomes more likely to take place. Because of these reasons, in conventional methods, dust generation out of the wafer itself during the wafer process can not be fully suppressed. This is one of the major causes which prevent an achievement of a denser and, accordingly, higher degree of, integration of ICs.

SUMMARY OF THE INVENTION

It is an object of the invention to provide a technique to reduce dust generation during wafer processes of high density, highly integrated semiconductor devices.

It is another object of the invention to improve production yield of high density, highly integrated semiconductor devices.

It is a further object of the invention to allow an achievement of higher density, higher degree of integration, integrated semiconductor devices.

In a wafer process according to the present invention, after at least one layer which constitutes a structural member of a functional semiconductor element is formed on a semiconductor wafer, an excessive deposition being brittle on an edge of the semiconductor wafer is removed by grinding or etching of the wafer edge until the underlying wafer is exposed. The removal of the deposition on the wafer edge reduces dust generation caused from crack and peel-off of the deposited layer on the wafer edge, even if the wafer edge contacts a jig, and the like. Thus, the reduction in dust generation improves production yields of highly integrated semiconductor device.

The above-mentioned features and advantages of the present invention, together with other objects and advantages, which will become apparent, will be more fully described hereinafter, with reference being made to the accompanying drawings which form a part hereof, wherein like numerals refer to like parts throughout.

BRIEF DESCRIPTION OF THE DRAWINGS

FIGS. 7(a), 7(b) and 7(c) schematically illustrate the steps of a second preferred embodiment of the method of the present invention.

DETAILED DESCRIPTION OF THE PREFERRED EMBODIMENTS

Figure 3A:
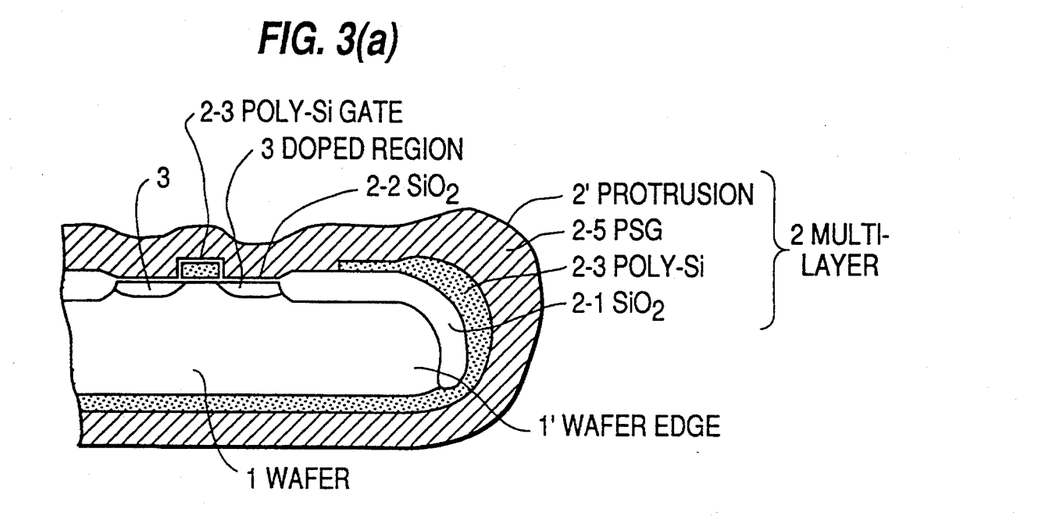
FIGS. 3(a), 3(b) and 3(c) schematically illustrate steps of a preferred embodiment of the method of the present invention.
Figure 3B:
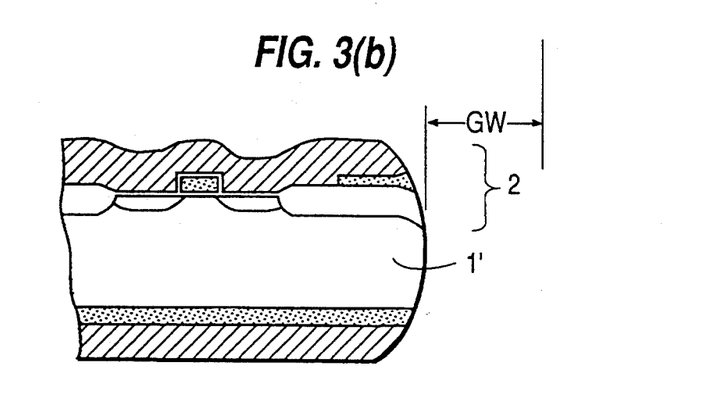
Figure 3C:
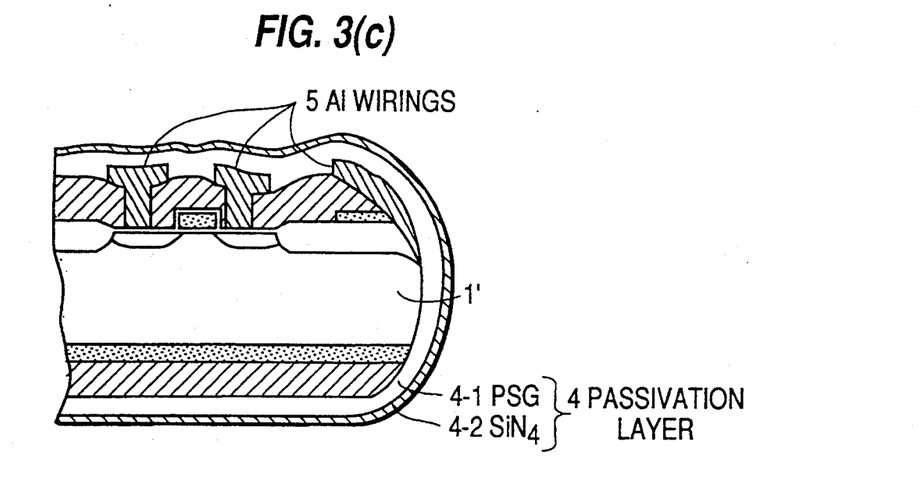

Preferred embodiments of the present invention are hereinafter described in detail, in reference to fabrication of a silicon MOS-type field effect transistor (referred to hereinafter as MOSFET) having 2 $\mu$m gate width and aluminum wiring. FIGS. 3(a), 3(b) and 3(c) schematically illustrate fabrication steps of a preferred embodiment of the present invention. In FIGS. 3(a), 3(b) and 3(c), the numeral 1 denotes a silicon semiconductor wafer; the numeral 2 denotes multiple layers formed on the semiconductor wafer; and the numeral 4 denotes a film formed after the grinding step. The semiconductor wafer 1 is a 6-inch diameter p-type silicon monocrystalline wafer with a (100) orientation. On the semiconductor wafer 1, a silicon dioxide film is formed so as to become an element isolation layer 2-1 according to a known LOCOS (local oxidization of silicon) method, This isolation layer 2-1 according to the LOCOS method extends thickly to the wafer edge 1'. Next, a silicon dioxide film to become a gate insulation film 2-2, and a polycrystalline silicon film to become a gate electrode 2-3 are sequentially deposited in lamination upon a region where an IC element, such as a transistor, diode or resistor, is to be formed, according to a generally known method. At this time, this polycrystalline silicon film 2-3 is deposited also on the back of the wafer. Next, the laminated layers of the silicon dioxide film and the polycrystalline silicon film are patterned according to known photo lithography and etching techniques so as to form a 2 $\mu$m wide gate structure. Next, arsenic (As) is doped by a well-known ion-implantation method through windows opened by the previous patterning process, as an n-type impurity into the wafer 1. Next, the impurity is activated as well-known by heat anneal so as to form source and drain regions 3 of a MOSFET. Next, a phospho-silicate glass (referred to hereinafter as PSG) film 2-5 as an interlayer isolation film is deposited over the entire surface of thus processed wafer. Basically, these steps are not particularly different from fabrication steps of general MOSFETs. The silicon dioxide layers 2-1 and 2-2, polycrystalline silicon layer 2-3 and PSG layer 2-5 are referred to as the multiple layers 2. During these deposition steps of the multiple layer 2, the deposition of the multiple layer 2 produces on the wafer edge 1' an abnormal protrusion as described in the Description of the Related Art. This state is schematically illustrated in FIG. 3(a).

Next, a 2 μm thick positive photoresist film is coated as a protection layer (not shown in the figure) upon the PSG film surface where the IC elements are to be formed, according to a generally known spin coat method. This protection layer is used to prevent damage, corrosion or a material from sticking on thus processed wafer surface during the steps subsequent to grinding or etching of the wafer edge 1'. It is preferable that this protection layer can be selectively removed after completion of the grinding or etching step. Other plastic film, metal film or insulating film may be employed alternatively in place of the positive photoresist film. The multiple layers 2, i.e., silicon dioxide layers 2-1 and 2-2, polycrystalline silicon layer 2-3 and PSG layer 2-5, deposited on the wafer edge 1'are removed by the use of a grinding wheel so as to expose the entire periphery 1' of the underlying silicon wafer 1. This state is schematically illustrated in FIG. 3(b). A method and a device to grind the wafer edge by using a grinding wheel is disclosed in Japanese Unexamined Patent Publication Tokukai Sho 62-154614. Ground width of the wafer measured from the original wafer periphery, denoted with GW between FIG. 3(a) and FIG. 3(b), is in a range of 0.5-20 mm. The wafer edge grinding must be such that the abnormally grown protrusion 2' of the deposited layers does not remain thereon, and is shaped round and mirror-finished, according to a chamfering process for general semiconductor wafers.

For providing the mirror finish of the wafer edge, an additional etching step with an etchant of a mixture of hydrofluoric acid and nitric acid, after the grinding step, using a grinding wheel is effective. Because the photoresist used as a protective film for the grinding step is resistive also to this hydrofluoric acid/nitric acid etchant, the photoresist also functions as a mask for the etching step. Therefore, no corrosion takes place on the PSG film 2-5 or on the silicon wafer 1 other than on the exposed portion on the edge. After the grinding step, abrasive powder sticking to the wafer or particles of the ground-off wafer, etc., are completely washed away with deionized water. Next, the now unnecessary photoresist is removed by a generally known ashing process in an oxygen plasma. For this photoresist removal step, the photoresist film may be removed by a wet process employing a generally employed resist stripping solution.

Next, contact holes reaching source and drain regions are respectively formed through the PSG film 2-5 by a generally known photo lithography/etching method. An aluminum alloy layer, for example, containing 2% Si, to become an electrode and wiring, is deposited thereon by a generally known sputtering method. Finally, a passivation layer 4, typically composed of PSG film 4-1 and silicon nitride ($SiN_4$) film 4-2, is deposited thereover for passivating the IC elements. Thus, the wafer process is finished. This state is shown in FIG. 3(c).

Figure 4:
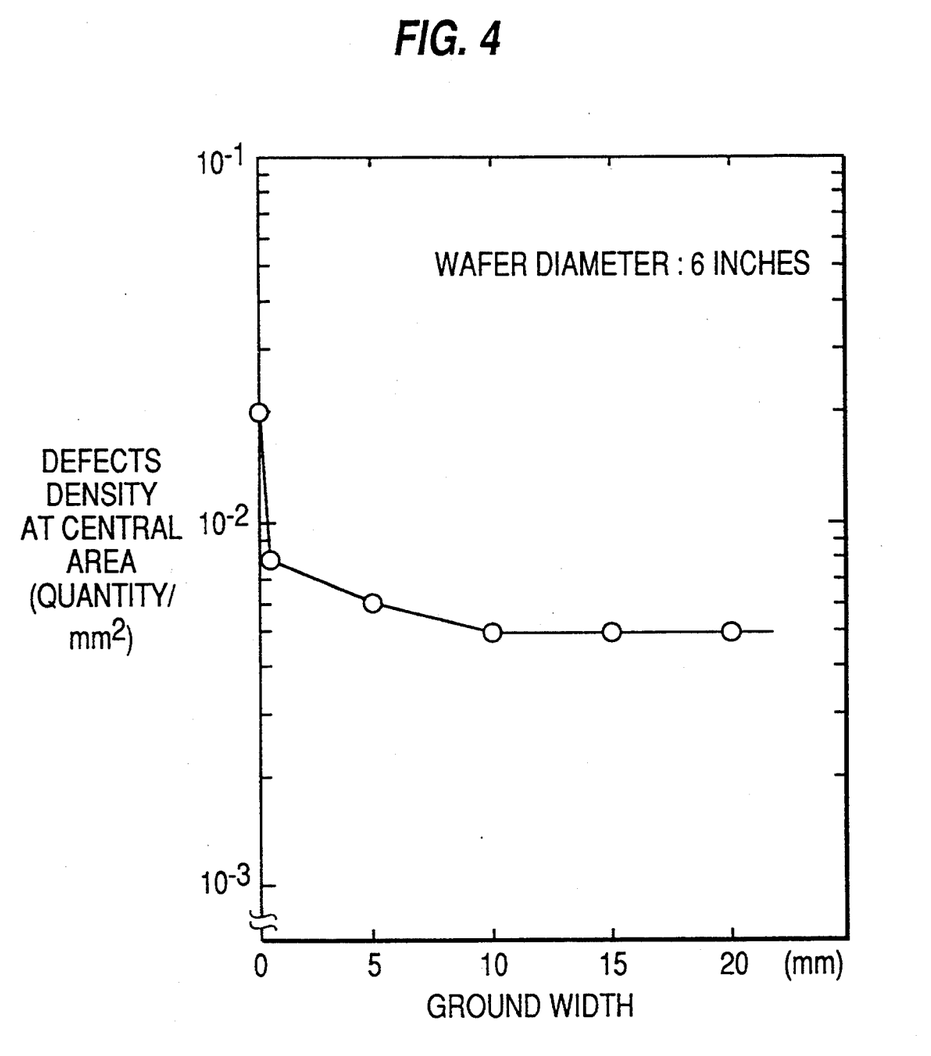
FIG. 4 is a graph showing defects density versus group width from an edge of the wafer.

Defects over 0.2 μm in size on a wafer processed according to the above-described method are counted by the use of a particle counter. FIG. 4 is a graph showing relation of ground width of the wafer edge versus density of the abovedescribed defects at the central area of the wafer. When the wafer edge was not ground at all (i.e. corresponding to the prior art) the defect density was approximately $2-10^{-2}/mm^2$ at the central area. However, an additional step of grinding the wafer edge as little as approximately 0.5 mm from the edge according to the present invention, between the steps of wafer process, has reduced the defect density at the central area down to approximately ½ of that of the prior art. Grinding of 10 mm from the edge has reduced the defects density down to approximately $5 \times 10^{-3}/mm^2$, approximately ¼ of that of the prior art having no grinding step. An increase in the grinding width to 15 mm or 20 mm did not exhibit any remarkable change in the defect density at the central portion.

Figure 5:
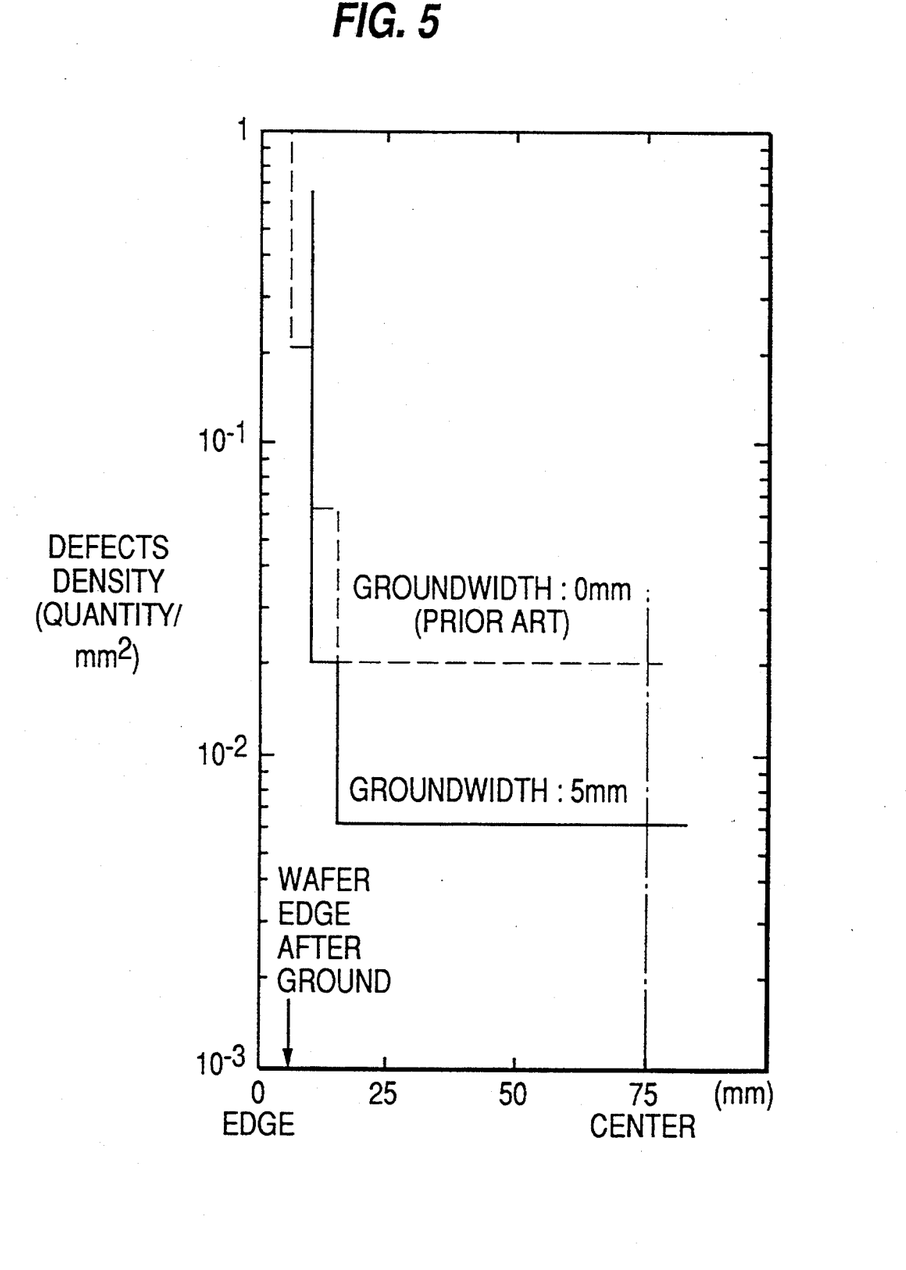
FIG. 5 is a graph showing a comparison of distribution of defects density along radial direction of the wafer, between the present invention and prior art.

In a graph in FIG. 5, distribution of the defect density along wafer's radial direction is plotted with a solid line for a wafer having 5 mm ground width in comparison with that of the prior art wafer, having no grinding step, plotted with a dotted line. As seen from the graph, the wafer processed according to the present invention yields a sufficient wafer area having less defects even though the diameter is reduced as much as 10 mm by the grinding process of the wafer edge and, furthermore, provides a smaller defects density over the entire processed wafer. The decrease in defect density by the present invention from that of the prior art method can be supposed to be owing to the suppression of the dust generated out of the wafer itself under process. This is because the jigs, as well as the chemicals, are quite identically used, except the existence of the grinding step.

Figure 6:
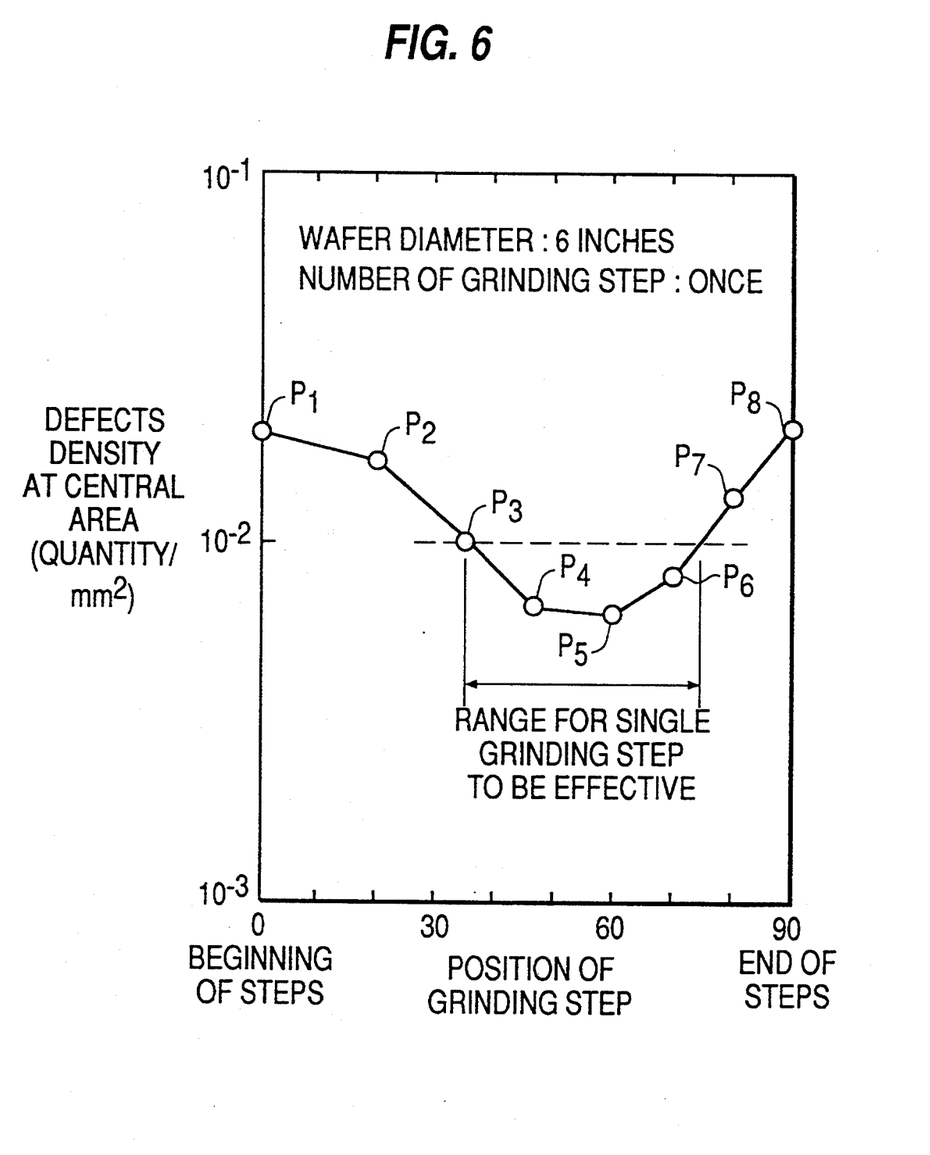
FIG. 6 is a graph showing defects density versus position of a single grinding step during wafer processes.

FIG. 6 is a graph showing relation of the position of a single grinding step in the wafer processes versus defects density after completion of the wafer processes, when the position of the grinding step is varied from its earliest step through the final step of the wafer processes while the other process conditions are kept quite identical with those of the previous preferred embodiment. In the graph, the abscissa indicates a position of the single grinding step represented with an ordinal number of the wafer processes. In these wafer processes there are at least ten layer-formation steps, such as two steps for LOCOS mask of $SiO_2/SiN_4$; for $SiO_2$ LOCUS; for gate insulation oxide ($SiO_2$); for polycrystalline silicon gate; two steps for inter layer isolation ($SiO_2/PSG$); for Al-Si wiring; and passivation layer ($PSG/SiN_4$). Furthermore, in the case of employing a barrier layer, a TiN or TiW layer is added. A $SiO_2$ film is sometimes required for the ion implantation to the source drain regions. In FIG. 6, small circles representatively show position $P_1$ at the beginning of the process steps; position $P_2$ for the LOCOS step for forming the element isolation layer 2-1; position $P_3$ for the formation of the gate isolation film 2-2; position $P_4$ for the formation of the polycrystalline silicon gate 2-3; position $P_5$ for the formation of the PSG layer 2-5; position $P_6$ for the formation of aluminum wiring 5; position $P_7$ for the formation of the passivation layer 4; and position $P_8$ for the end of the process steps. The above-described grinding step carried out just before the wiring step (graphed in FIG. 3(c) and FIG. 4) corresponds to the data before position $P_6$ of FIG. 6. It is apparent from FIG. 6 that a single step of grinding the wafer edge carried out within a range of ⅛ to 5/6 from the beginning of the entire 90 steps of wafer processes can reduce the defects density down to below approximately ½ of that of the prior art. At position $P_2$, the abnormal deposition is not considerable yet, and a majority of the dust is generated in the later steps; therefore the grinding is not effective there. At position $P_7$, the dust has been generated already at the earlier steps; therefore the grinding is not effective there. The step position where, among the entire steps of wafer processes, such a wafer edge grinding step should be carried out is appropriately determined in consideration of operation efficiency and its effects in view of the total flow of the wafer processes. In the fabrication of semiconductor devices where the production is in small quantity but in many kinds, it has been a general method that the wafers processed up to a step prior to the formation of the wiring are stocked, and many different kinds of semiconductor devices having each variation of the patterns are fabricated later from the stock. Accordingly, it is most preferable to carry out the wafer edge grinding step just prior to the wiring formation process. Moreover, as shown in FIG. 4, the increase in the ground width causes no problem at all in view of preventing the dust generation. Therefore, a six inch diameter semiconductor wafer formed with semiconductor elements, etc., on which wiring is to be formed, and ground down to four inches or five inches, allows the subsequent wiring steps to use already existing production lines for five inch or four inch wafers. Thus, such semiconductor devices in small quantity but in many kinds, that do not require production facilities of large size wafers, can be efficiently produced. Still moreover, it is also advantageous in an improvement of the production efficiency as well as the production flexibility that the processes prior to the wiring process can be done on a common, large semiconductor wafer. Needless to say, in fabricating a semiconductor device in massive quantity it is convenient to use a same production line from the beginning to the final step.

In the above-described embodiment, an example where, through the wafer processes, the wafer edge grinding occurred only once. However, it is apparent that this grinding step may be carried out plural times depending on the requirements. It is also needless to say that such a process carried out on each layer deposition step of various layers is effective from only the view point of dust generation protection.

Furthermore, though in the description of the preferred embodiment the entire circle of the wafer edge was ground, a portion having less chance to directly contact the jigs, etc., may be omitted from being ground. Then, the grinding process can be simplified, resulting in an improvement of the production efficiency.

Figure 7A:
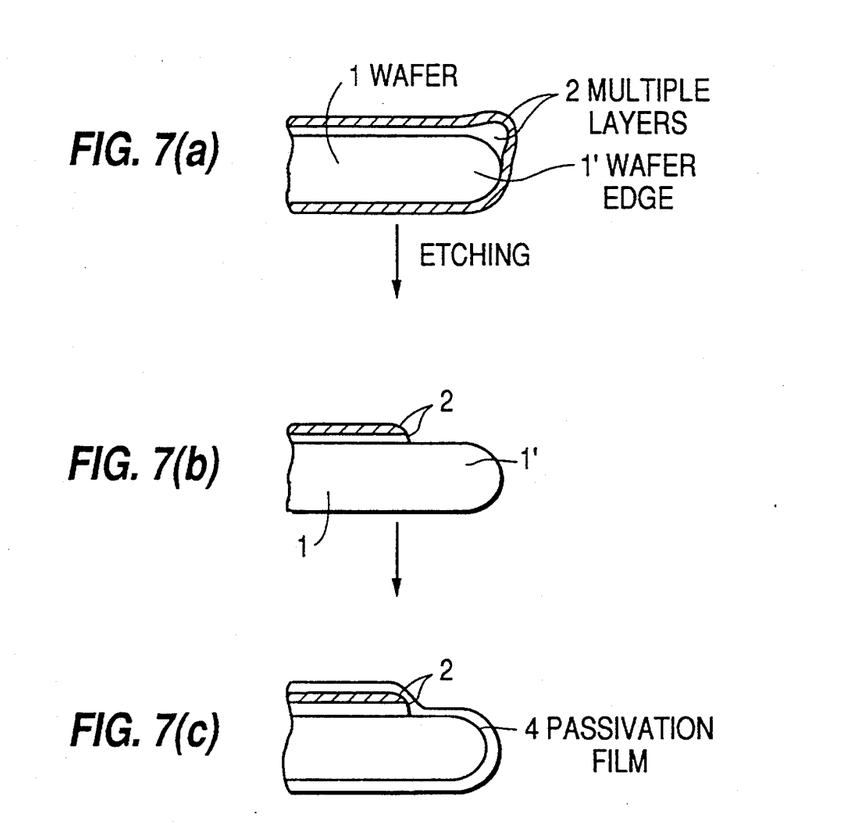

FIGS. 7(a), 7(b) and 7(c) schematically illustrate main steps of a second preferred embodiment of a method of the present invention. In FIGS. 7(a), 7(b) and 7(c), detailed parts of the multiple layer 2, such as silicon dioxide layer 2-1, the gate insulation layer 2-2, a polycrystalline silicon layer 2-3, drain and source regions 3 and the PSG layer 2-5, are simply drawn as a multiple layer 2. The aluminum wiring 5 is not shown in FIG. 7(c). Part members in common with those of FIGS. 3(a), 3(b) and 3(c) are denoted with the same numerals. A difference between the second preferred embodiment and the above described preferred embodiment is that in order to remove the abnormal protrusion 2' on a wafer edge 1', in the second preferred embodiment an etching process is employed instead of the grinding process using a grinder wheel employed in the preferred embodiment. Processes for fabricating the element isolating regions, gate electrode structure, source and drain regions and PSG film as inter-layer isolation are identical with those of the previous preferred embodiment. This state is shown in FIG. 7(a). Next, after a protection layer (not shown in the figure) formed of photo resist is deposited in the same way as that of the previous preferred embodiment, each of the multiple layers 2 is sequentially etched away by the use of an etching solution of the hydrofluoric acid family or an etching solution formed of a mixture of hydrofluoric acid and nitric acid, etc., until the not-covered peripheral portion 1' of the underlying silicon substrate 1 is exposed. This state is shown in FIG. 7(b). At this time, if the above-described protection layer has been coated only upon a surface forming the semiconductor elements, unnecessary layers deposited upon the opposite surface of the wafer during the vapor deposition process, etc., can be concurrently etched away. Then, after the protection layer is removed a wiring pattern is formed, in the same way as the previous preferred embodiment. This state is shown in FIG. 7(c). Thus, the wafer process is completed. It was confirmed that the etching of an approximately 5 mm width from the wafer edge for the entire circle of the wafer provides the equal effect of preventing dust generation as does the previously described 5 mm grinding from the wafer edge.

Employing a selective etching solution in the etching step, the etching can be terminated on the surface of the original substrate; thus, the wafer diameter does not become smaller for each time like in the case of grinding. Therefore, this is particularly advantageous in fabricating such semiconductor devices that are produced on a same production line from the beginning through the end.

Furthermore, the etching process does not employ the material which itself produces the dust, such as the abrasive material; therefore, all the wafer processes can be done in a highly clean condition, advantageously resulting in an easy process control, too. It is needless to say that a dry etching process may be also employed in place of the wet etching process.

Though in the above embodiments only the fabrication of a MOS integrated circuit is referred to, the principle of the present invention can be applied not only to the fabrication of the MOS integrated circuit but also to the fabrication of any other type of semiconductor devices.

Though in the above embodiments only a single set of multiple layers 2 is referred to, it is apparent that the layers formation can be carried out as many times as required, such as for forming multi-layer wirings, and the like.

As described above, according to the present invention, an abnormal protrusion of deposited layers which has been formed on a wafer edge during wafer processes to fabricate semiconductor devices, and is likely to peel off on touching jigs, etc., during wafer handling, thus causing dust generation, is removed by grinding or etching before it peels off. Therefore, the dust generation is suppressed even if the wafer edge contacts jig, etc., resulting in an improvement of production yield of the semiconductor devices. Consequently, production yield of semiconductor devices, such as very high density, very highly integrated ICs, is particularly improved, thus resulting in a beneficial effect of achieving higher density, higher degree of integration of the semiconductor devices of sub-micron element sizes.

The many features and advantages of the invention are apparent from the detailed specification and thus, it is intended by the appended claims to cover all such features and advantages of the system which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

We claim:

1. A method of fabricating semiconductor devices, comprising the steps of:
   preparing a semiconductor wafer having a major surface, a minor surface with a side edge and an area of said major surface where functional semiconductor elements are to be fabricated, said area having an insulating layer covering said major surface, said insulating layer constituting a portion of said functional semiconductor elements, said area further having a second layer on said insulating layer, said second layer constituting a portion of said functional semiconductor elements; and
   grinding or etching the peripheral portion of said insulating layer and said second layer, so as to expose the side edge of said semiconductor wafer underlying said insulating layer and said second layer, said grinding or etching step being an intermediate step within an entire succession of steps for fabricating said functional semiconductor elements onto said semiconductor wafer.

2. A method of fabricating semiconductor devices as recited in claim 1, wherein said grinding or etching step is carried out so as to remove a protrusion on said peripheral portion of said insulating layer and said second layer.

3. A method of fabricating semiconductor devices as recited in claim 1, wherein said grinding or etching step is carried out so that said exposed side edge of said semiconductor wafer under said first and second layers has a curvature with a mirror finish surface.

4. A method of fabricating semiconductor devices as recited in claim 1, wherein prior to said grinding or etching step a protection layer is formed so as to cover at least a portion of said area of said major surface of said semiconductor wafer.

5. A method of fabricating semiconductor devices as recited in claim 1, wherein said grinding or etching step is carried out prior to a step of fabricating wiring of said functional semiconductor elements.

6. A method of fabricating semiconductor devices as recited in claim 1, wherein said grinding or etching step is carried out after a step of forming a gate insulation film of said functional semiconductor elements and prior to a step of forming a passivation layer of said functional semiconductor elements.

7. A method of fabricating semiconductor devices as recited in claim 1, wherein said grinding or etching step is carried out at each step of forming said insulating layer and forming said second layer.

8. A method of fabricating semiconductor devices as recited in claim 4, wherein said grinding or etching step is carried out prior to a step of fabricating wiring of said functional semiconductor elements.

9. A method of fabricating semiconductor devices as recited in claim 4, wherein said grinding or etching step is carried out after a step of forming a gate insulation film of said functional semiconductor elements and prior to a step of forming a passivation layer of said functional semiconductor elements.

10. A method of fabricating semiconductor devices as recited in claim 4, wherein said grinding or etching step is carried out at each step of forming said insulating layer and forming said second layer.

11. A method of fabricating semiconductor devices as recited in claim 1, wherein said step of grinding or etching is repeated plural times during wafer processes for fabricating said functional semiconductor elements.

12. A method of fabricating semiconductor devices, comprising the steps of:
    preparing a semiconductor wafer having a major surface, a minor surface with a side edge and an area of said major surface where functional semiconductor elements are to be fabricated, said area having an insulating layer covering said major surface, said insulating layer constituting a portion of said functional semiconductor elements, said area further having a second layer on said insulating layer, said second layer constituting a portion of said functional semiconductor elements; and
    grinding or etching the peripheral portion of said insulating layer, said second layer and said semiconductor wafer, so as to expose the side edge of said semiconductor wafer underlying said insulating layer and said second layer, said grinding or etching step being an intermediate step within an entire succession of steps for fabricating said functional semiconductor elements onto said semiconductor wafer.

13. A method of fabricating semiconductor devices as recited in claim 1, wherein:
    said grinding or etching step is carried out so as to further expose a peripheral portion of said major surface of said semiconductor wafer.

14. A method of fabricating a semiconductor device, comprising the steps of:
    (a) preparing a semiconductor wafer having a major surface and a side edge, said major surface including an area where functional semiconductor elements are to be fabricated;
    (b) forming an element isolation layer on said major surface and said side edge of said semiconductor wafer;
    (c) forming an isolation film on said area of said major surface of said semiconductor wafer;
    (d) grinding or etching, after steps (b) and (c), a peripheral portion of said element isolation layer, so as to expose said side edge of said semiconductor wafer underlying said element isolation layer; and
    (e) forming, after step (d), a passivation layer on said major surface of said semiconductor wafer.

15. A method of fabricating a semiconductor device as recited in claim 14, further comprising the step of:
    forming, prior to step (d), a polycrystalline silicon film on said element isolation layer and on said isolation film, and wherein step (d) further includes the substep of grinding or etching a peripheral portion of said polycrystalline silicon film, so as to expose said peripheral portion of said element isolation layer.

16. A method of fabricating a semiconductor device as recited in claim 15, further comprising the step of:
    forming, after step (d), a wiring layer on said polycrystalline silicon film.

* * * * *